United States Patent [19]

Mosley, Jr. et al.

[11] 4,234,966
[45] Nov. 18, 1980

[54] DOUBLE BALANCED DIODE MIXER WITH D.C. RESPONSE

[75] Inventors: William H. Mosley, Jr., St. Petersburg; Carl F. Andren, Indialantic, both of Fla.

[73] Assignee: E-Systems, Inc., Dallas, Tex.

[21] Appl. No.: 15,231

[22] Filed: Feb. 26, 1979

[51] Int. Cl.³ .............................................. H04B 1/26
[52] U.S. Cl. .................................. 455/326; 329/146; 307/321
[58] Field of Search ............... 325/446, 442, 445, 449, 325/435, 388, 163; 363/157, 158, 159; 328/143, 160, 158, 161, 104; 307/321; 329/146, 147, 104; 455/313, 323, 325, 326, 330

[56] References Cited

U.S. PATENT DOCUMENTS

| 2,519,223 | 8/1950 | Cheek | 328/160 |
|---|---|---|---|
| 3,159,790 | 12/1964 | Pratt | 325/442 |
| 3,390,343 | 6/1968 | Carter | 329/146 |
| 3,517,338 | 6/1970 | Herman et al. | 325/163 |
| 3,622,895 | 11/1971 | Starkey et al. | 329/104 |
| 3,831,097 | 8/1974 | Neuf | 325/446 |
| 3,925,136 | 12/1975 | Lohrmann | 307/321 |
| 3,973,201 | 8/1976 | Andren | 325/163 |

Primary Examiner—Benedict V. Safourek
Assistant Examiner—Tommy P. Chin
Attorney, Agent, or Firm—Albert M. Crowder, Jr.; Robert V. Wilder

[57] ABSTRACT

A direct current responsive mixing circuit (10) includes three mixers (14, 16 & 18), each having one D.C. port and two A.C. ports. The D.C. ports are responsive to D.C. and A.C. signals, while the A.C. ports are responsive only to A.C. signals. One mixer (14) has an A.C. port (24) receiving a pump signal and a D.C. port (28) receiving an I input signal. A second mixer (16) has an A.C. port (26) receiving the pump signal and a D.C. port (32) receiving a Q input signal. The remaining A.C. ports of the first two mixers (14 and 16) are connected to the two A.C. ports (36 and 38) of the third mixer (18). An output signal having a component corresponding to the product of the I and Q input signals is produced at the D.C. port (40) of the third mixer (18). In this construction, the mixing circuit 10 is responsive to A.C. and D.C. input signals and may produce a D.C. output signal component.

13 Claims, 7 Drawing Figures

DOUBLE BALANCED DIODE MIXER WITH D.C. RESPONSE

TECHNICAL FIELD

The present invention relates to a circuit mixer, and particularly relates to a mixer having direct current response for producing the product of two input signals.

BACKGROUND OF ART

Double balanced diode mixers are used to multiply or mix two electrical signals to produce a product signal. Such mixers have many applications in electronics and, particularly, in communications electronics. A known radio frequency (RF) mixer utilizes a diode quad connected between the secondary coils of two transformers. The diode quad usually consists of two diodes biased in the same direction connected between like terminals of the two transformers. The diode quad further consists of two additional diodes biased in the same direction but opposing the direction of the first two diodes and connected between unlike terminals on the two transformers. In this construction, the two additional diodes are criss-crossed between the terminals of the two transformers. An RF port and a LO (local oscillator) port of such mixers are formed by the terminals of the primary coils of the two transformers, and an IF (intermediate frequency) port is formed by two terminals connected to the mid-region of each secondary coil of the two transformers.

This type of conventional mixer has D.C. (direct current) response at the IF port, but the RF and LO ports have only A.C. (alternating current) response. For many applications, this frequency response is adequate. However, in some mixer applications, such as in a Costas Loop Type Phase Shift Keyed Demodulator, some of the mixers must have D.C. response on all three ports. To produce such D.C. responsive mixer, it is known to use multiplication techniques. However, this type of mixer is band width restricted to data rates below about 1 megahertz. For high data rates extending into the UHF range, a need exists for a mixer with three ports, each having a frequency response ranging from D.C. through the entire UHF band.

DISCLOSURE OF THE INVENTION

In the direct current responsive mixing circuit of the present invention, first, second and third mixers are utilized with each of the mixers having a first D.C. responsive port and second and third A.C. only responsive ports. Each mixer is operable to generate an electrical signal at one of the ports corresponding to the product of two electrical signals received at the other two of the mixer ports. The first port on the first and second mixers receives two input signals, and the second port on two of said mixers receives a pump signal to A.C. couple the first, second and third mixers. The first port on the third mixer produces a final output corresponding to the product of the two input signals and including a signal component having a frequency of twice the frequency of the pump signal.

In accordance with a more particular embodiment of the present invention, a direct current responsive mixing circuit receives a pump signal and first and second input signals and produces an output signal corresponding to the product of the input signals. The mixing circuit includes first, second and third mixers with each of the mixers having first, second and third ports for receiving and transmitting electrical signals. The first port of each of said mixers is D.C. responsive with the first port of the first mixer receiving the first input signal and the first port of the second mixer receiving the second input signal. The second port of the first and second mixers also receives the pump signal.

The third port of the first mixer is operable to produce a first output signal at the first mixer corresponding to the product of the first input signal and the pump signal. The third port of the second mixer is operable to produce a second output signal at the second mixer corresponding to the product of the second input signal and the pump signal. The second and third ports of the third mixer are connected to the third ports of the first and second mixers for receiving the first and second output signals, and the third mixer is operable to produce a final output signal at the first port of the third mixer corresponding to the product of the first and second output signals. The final output signal is equal to ½ the product of the two input signals plus an additional high frequency component.

In accordance with another particular embodiment of the present invention, a direct current responsive mixing circuit receives first and second input signals and a pump signal and produces a final output signal corresponding to the product of the first and second input signals. The mixing circuit includes first, second and third mixers, each of the mixers having first, second and third ports for receiving two signals and producing a third signal corresponding to the product of the two signals. The first port of each of the mixers is D.C. responsive, and such D.C. responsive ports form a pair of input ports and an output port for the mixing circuit.

The first mixer receives the first input signal at the first port and receives the pump signal at the second port to produce a first output signal at the third port corresponding to the product of the pump signal and the first input signal. The second mixer receives the second input signal at the first port and receives the first output signal at the second port to produce a second output signal at the third port corresponding to the product of the pump signal and the first and second input signals. The third mixer receives the second output signal at the second port and receives a pump signal at the third port to produce a final output signal at the first port corresponding to the product of the first and second input signals and the square of the pump signal. The final output signal is equal to ½ the product of the first and second input signals plus a signal component having a frequency of twice the frequency of the pump signal.

BRIEF DESCRIPTION OF THE DRAWINGS

The present invention may be best understood by reference to the following Detailed Description in conjunction with the following Drawings in which.

DETAILED DESCRIPTION

Figure 1:
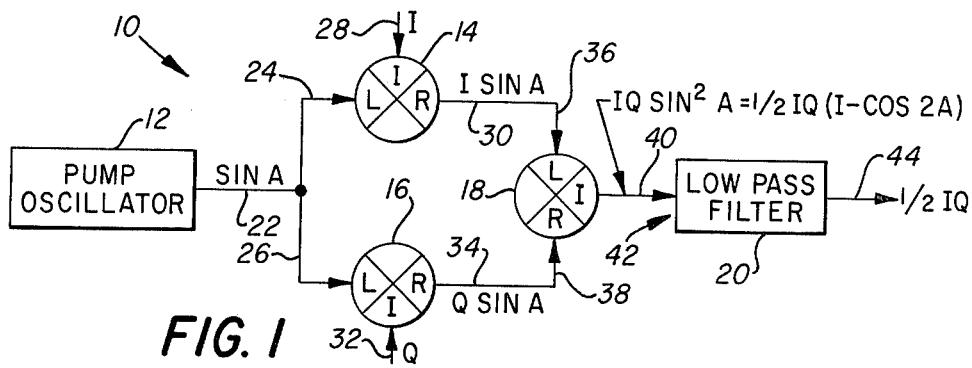
FIG. 1 diagrams the D.C. responsive mixing circuit of the present invention.

Referring now to the Drawings in which like reference characters designate like or corresponding parts throughout the several views, there is shown in FIG. 1 a mixing circuit 10 embodying the present invention. The mixing circuit 10 includes a pump oscillator 12, two input mixers 14 and 16, an output mixer 18 and a low pass filter 20. The mixers 14, 16 and 18 are conventional double balanced diode mixers having one D.C. responsive port and two A.C. only responsive ports. The pump oscillator 12 generates a pump signal of sin A at the pump output 22. The pump signal is sinusoidal with frequency represented by the letter "A". Preferably, the pump oscillator 12 is chosen to produce a pump signal having a frequency higher than twice the bandwidth required for the mixer.

The pump signal is received at the local oscillator ports 24 and 26 of the input mixers 14 and 16, respectively. A first input signal, an I signal, is received at the intermediate frequency port 28 of the input mixer 14, and a first output signal, I sin A, is produced at the radio frequency port 30 of the input mixer 14. The I sin A signal produced at port 30 is the product of the sin A signal and the I signal received at ports 24 and 28, respectively.

A second input signal, a Q signal, is received at the intermediate frequency port 32 of the input mixer 16, and a second output signal, Q sin A, is produced at a radio frequency port 34 of the input mixer 16. The Q sin A signal produced at port 34 is the product of the sin A signal and the Q signal received at ports 26 and 32, respectively.

The I sin A signal and the Q sin A signal are received by the output mixer 18 at a local oscillator port 36 and a radio frequency port 38, respectively. In response thereto, a final output signal, IQ $\sin^2$ A, is produced at an intermediate frequency port 40 of the output mixer 18 which is the product of the I sin A signal and the Q sin A signal. The IQ $\sin^2$ A signal may also be expressed, by mathematical identity, as $\frac{1}{2}$ IQ $-\frac{1}{2}$ IQ cos 2A. Thus, the signal at port 40 corresponds to the product of the input signals and includes a high frequency component of $\frac{1}{2}$ IQ cos 2A having a frequency of twice the frequency of the pump signal.

Port 40 is connected to an input terminal 42 of a low pass filter 20 that filters the high frequency component, $\frac{1}{2}$ IQ cos 2A, from the final output signal. Thus, a filter output signal of $\frac{1}{2}$ IQ is produced at a filter output 44.

Figure 2:
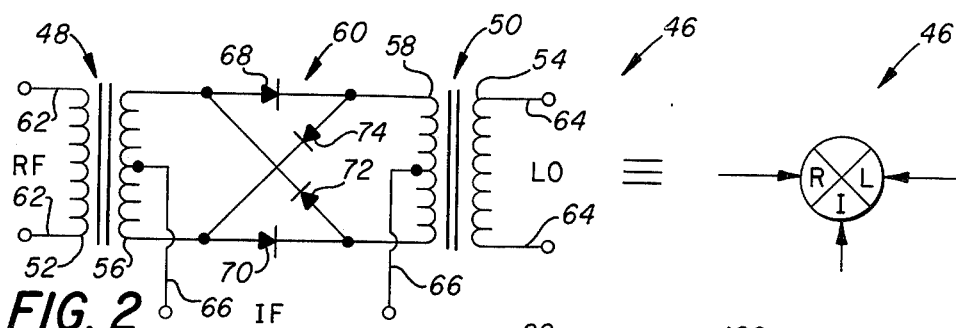
FIG. 2 diagrams a standard double balanced diode mixer used as a component in the present invention.

Referring now to FIG. 2, a conventional double balanced diode mixer 46 is shown that may be utilized in the present invention as mixer 14, 16 or 18 shown in FIG. 1. The mixer 46 includes transformers 48 and 50, each having primary coils 52 and 54 and secondary coils 56 and 58, respectively, and a diode quad 60 is connected between the secondary coils 56 and 58. The terminals of the primary coil 52 form an RF port 62, while the terminals of the primary coil 54 form a local oscillator port 64 of the mixer 46. An intermediate frequency port 66 is formed by conductors or terminals connected to the center taps of secondary coils 56 and 58.

The diode quad 60 includes two diodes 68 and 70 connected between like terminals of the secondary coils 56 and 58, both biased towards the transformer 50. A second pair of diodes 72 and 74 are connected in a criss-cross manner between unlike terminals of the secondary coils 56 and 58, and each of the diodes 72 and 74 is biased towards the transformer 48.

In a typical operation of mixer 46, a local oscillator signal is applied to the local oscillator port 64 and a data signal is applied to the intermediate frequency port 66. An output signal at the radio (RF) frequency port 62 is the product of the local oscillator signal and the data signal. In the above described construction, only the intermediate frequency port 66 is D.C. responsive, while the radio frequency (RF) port 62 and the local oscillator port 64 are both only A.C. responsive.

Referring back to FIG. 1, it will be appreciated that the pump oscillator 12 is used to achieve A.C. coupling amongst the mixers 14, 16 and 18 between their A.C. ports, so that information may be exchanged between the mixers through such A.C. ports. The pump signal, sin A, is applied to mixers 14 and 16 through the local oscillator ports 24 and 26 which are A.C. only responsive. Signals are transmitted from mixers 14 and 16 to mixer 18 through the radio frequency ports 30 and 34 to the local oscillator port 36 and the radio frequency port 38, all of which ports are also A.C. only responsive. The two input signals, the I signal and Q signal, are applied to the intermediate frequency ports 28 and 32, which are D.C. responsive, and the final output signal is derived from the intermediate frequency port 40 of mixer 18 which is also D.C. responsive. Thus, the overall mixing circuit 10 is D.C. responsive at all three external ports.

In a typical operation, such as in a Costas loop, the I signal is passed through a limiter, so that it provides information only as to the phase of the signal being received. The Q signal is maintained at a low level to provide linearity in the mixer 16. Also, as an implementation requirement, the level of the output signal at port 30 of mixer 14 must be large enough to provide sufficient pump power to the mixer 18 in order to produce reasonable losses.

Figure 3:
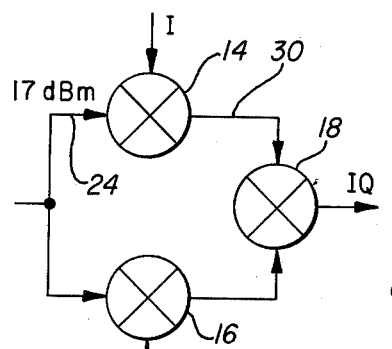
FIG. 3 diagrams an embodiment of the mixing circuit using high and low level double balanced diode mixers.

One approach to providing the necessary pump power to mixer 18 is shown in FIG. 3. In this embodiment, mixers 14 and 16 are high level double balanced diode mixers, and mixer 18 remains a low level double balanced diode mixer. The high level mixers 14 and 16 include diode quads which contain two diodes per leg as opposed to the standard one diode per leg. The signal level from the pump oscillator 12 is increased to approximately 17 dBm, which is received at the local oscillator port 24. In the above construction, the resultant output signal on radio frequency port 30 has sufficient power to drive a standard low level mixer, such as mixer 18.

Figure 4:
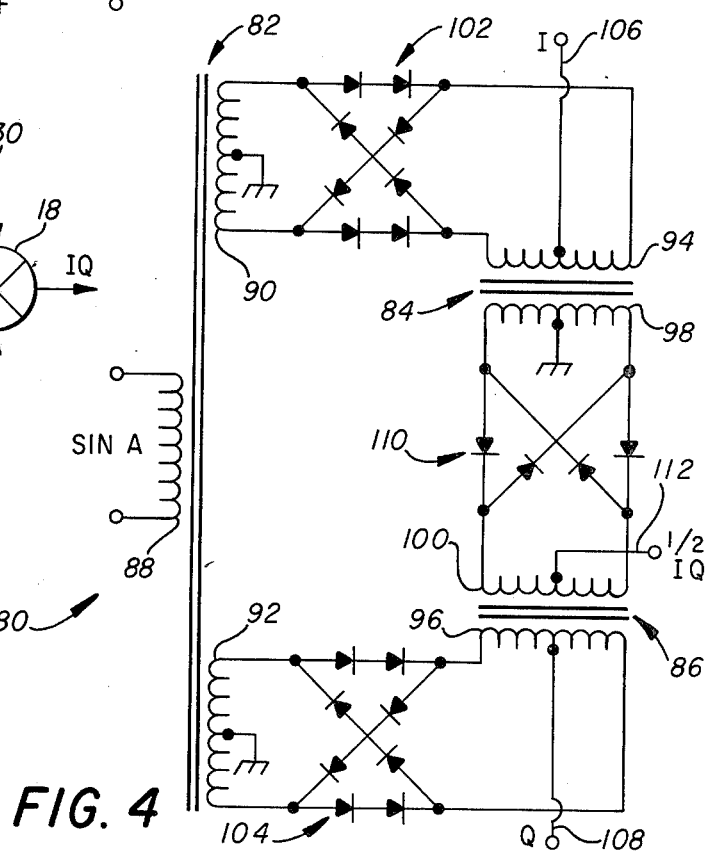
FIG. 4 diagrams an embodiment of the present invention utilizing high and low level double balanced diode mixers with only three transformers.

Referring now to FIG. 4, there is shown a circuit 80 representing an alternate embodiment of the present invention. Circuit 80 includes only three transformers 82, 84 and 86 instead of the usual six transformers that would be required if discrete mixers were used in the construction of the present invention.

The transformer 82 includes a primary coil 88 and secondary coils 90 and 92 which are coupled together magnetically in a conventional manner. The primary coil 88 receives a local oscillator signal, and the center taps of each of the secondary coils 90 and 92 are grounded. The D.C. coupled ports, such as port 106, of the subject invention can be used either single-ended as shown or doubled ended (floating or differential). Transformers 84 and 86 include primary coils 94 and 96 and secondary coils 98 and 100, respectively, that are magnetically coupled in the conventional manner.

A high level diode quad 102 is coupled between the secondary coil 90 and the primary coil 94. The high level diode quad 102 is substantially similar to the diode quad 60 shown in FIG. 2, except that each diode in diode quad 60 is replaced by two diodes in series to form the diode quad 102. Each leg of the diode quad 102 includes two diodes. Another high level diode quad 104 is connected between the secondary coil 92 and the primary coil 96.

A terminal extends from the center tap of the primary coil 94 and forms the I port 106 of the mixer circuit 80, and likewise, a terminal extends from the center tap of the primary coil 96 and forms the Q port 108 of the mixer circuit 80. A low level mixer diode quad 110 is connected between the secondary coils 98 and 100 in substantially the same manner as shown by diode quad 60 in FIG. 2. The center tap of the secondary coil 98 is grounded, and a terminal is attached to the center tap of secondary coil 100 and forms an intermediate frequency output port 112. Each of the ports 106, 108 and 112 are D.C. responsive intermediate frequency ports corresponding in function to ports 28, 32 and 40 shown in FIG. 1.

A pump signal, sin A, is applied through transformer 82, and I and Q input signals are applied through ports 106 and 108. The I and Q signals are separately mixed with the pump signal in diode quads 102 and 104 and associated circuitry, respectively, to produce I sin A and Q sin A signals, which signals are then mixed in diode quad 110 and associated circuitry. An output signal is produced on port 112 corresponding to IQ sin$^2$ A which is equivalent to ½ the product of the I and Q signals from ports 106 and 108 plus a high frequency component ($-\frac{1}{2}$ IQ cos 2A) having a frequency of twice the pump signal frequency.

Figure 5:
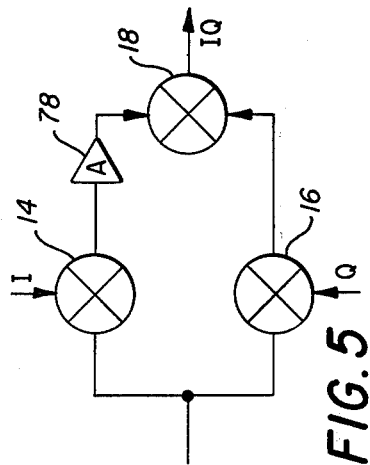
FIG. 5 diagrams an alternate embodiment of the present invention utilizing an amplifier to insure sufficient pump power for one of the double balanced diode mixers.

Referring now to FIG. 5, an alternate embodiment of the invention is shown with an amplifier 78 connected between mixers 14 and 18. The amplifier 78 is chosen to amplify the output of mixer 14 to a power level sufficient to "pump" mixer 18 so that mixers 14 and 18 are better coupled. In the construction shown in FIG. 5, information may be transferred from mixer 14 to mixer 18 with reasonably small losses.

Figure 6:
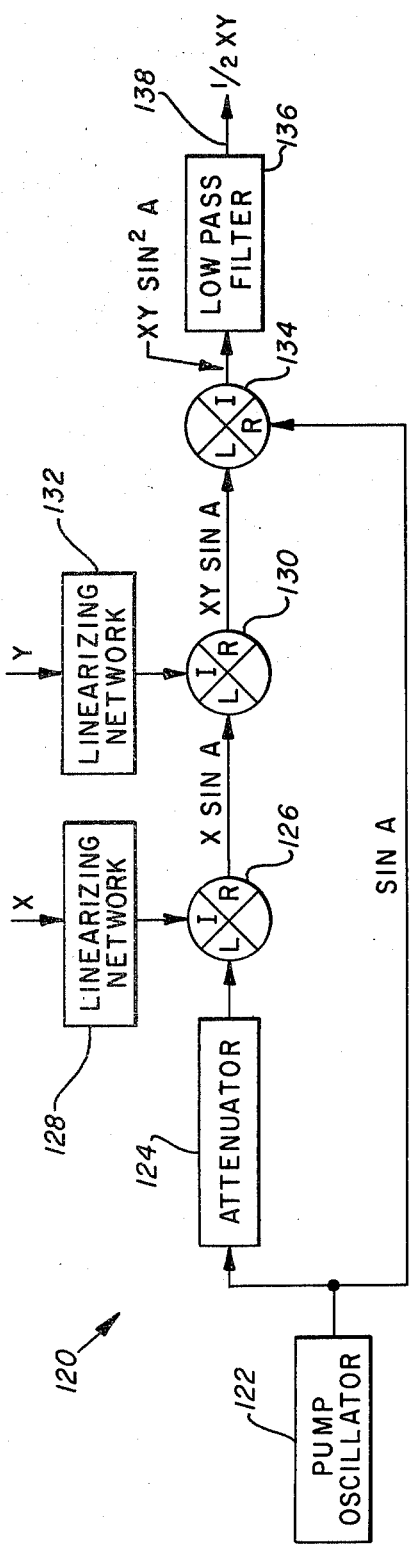
FIG. 6 diagrams an alternate embodiment of the present invention utilizing an attenuator and two linearizing networks.

Referring now to FIG. 6, a mixer circuit 120 is shown as an alternate embodiment of the present invention. In mixer circuit 120, a pump oscillator 122 supplies a pump signal to an attenuator 124 that attenuates the pump signal by 10 decibels to insure operation in the linear range of mixer 126. The attenuated pump signal, which may be represented as a sin A where A represents the frequency of the pump signal, is supplied from the attenuator 124 to a double balanced diode mixer 126 at its local oscillator port. An X input signal is applied through a linearizing network 128 to the intermediate frequency port of mixer 126, and an output signal corresponding to the product of X and sin A is produced at the radio frequency port of mixer 126 which is applied to the local oscillator port of a mixer 130.

A Y input signal is supplied through a linearizing network 132 to the intermediate frequency port of the mixer 130. An output signal is produced at the radio frequency port of mixer 130 corresponding to the product of the X and Y input signals and the sin A signal. The output signal of mixer 130 is applied to the local oscillator port of a mixer 134 and the pump signal, sin A, is applied to the radio frequency port of mixer 134. An output signal is produced at the intermediate frequency port of mixer 134 corresponding to the product of the X and Y input signals and the square of the pump signal, sin$^2$ A. Thus, the output of mixer 134 is equivalent to ½XY−½XY cos 2A. The output signal of mixer 134 is applied through a low pass filter 136 to produce an output signal of ½ XY at the filter output 138.

Each of the mixers 126, 130 and 134 is a standard double balanced diode mixer having a D.C. response at the intermediate frequency ports with radio frequency ports and local oscillator ports having only A.C. response. In circuit 120, the intermediate frequency ports of mixers 126 and 130 operate as input ports for the X and Y signals. The intermediate frequency port of mixer 134 acts as an output of the mixer circuit 120. Thus, all three external ports of the mixer circuit 120 are D.C. responsive with the pump signal operating to couple the A.C. responsive ports of mixers 126, 130 and 134.

In the configuration shown in FIG. 6, the first mixer acts as a double side band suppressed carrier modulator, and linearization of the modulation performance is supplied by the linearizing network 128 which is described in U.S. Pat. No. 3,973,201. The mixer 126, thus, modulates the pump signal with the linear signal "X" to achieve X sin A. The mixer 130, like mixer 126, is operated with a linearizing network 132 at a radio frequency level to produce XY sin A. The product XY sin A of mixer 130 is demodulated by mixing in the mixer 134 the unattenuated pump signal sin A to produce the final output signal XY sin$^2$ A. This final output signal is equal to ½ XY−½XY cos 2A, and the high frequency component may be removed by a low pass filter to achieve the ultimate output of ½ XY.

The alternate embodiment described and shown in FIG. 6 provides linearization and multiplication of two variables and has a band width extending from D.C. to ½ of the pump signal frequency, ½ A. Since double balanced diode mixers are available utilizing Schotky diodes with band widths extending into the gigahertz range, the mixer circuit 120 has a band width many orders of magnitude greater than the known prior art. In this configuration, for lower frequency signals requiring greater dynamic range, the mixers 126, 130 and 134 can be changed from Schotky diode types to PIN diode types.

Figure 7:
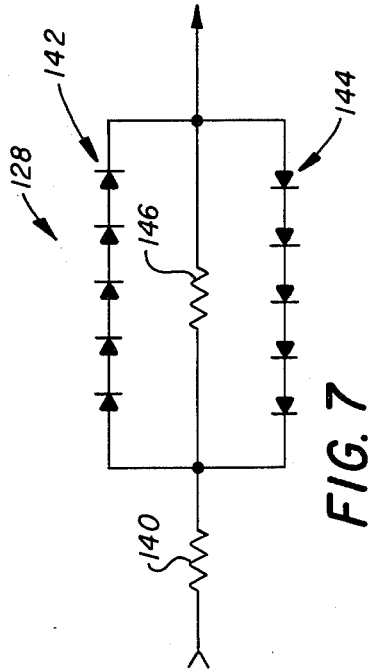
FIG. 7 diagrams a linearizing network.

Referring now to FIG. 7, there is shown a detail view of the linearizing network 128. It will be understood that network 132 is substantially identical to network 128 in construction and function. The network 128 includes a resistor 140 of approximately 100 ohms connected in series with the parallel combination of five forward biased diodes 142, five reverse biased diodes 144, and a resistor 146 having a resistance of about 5.6 k. The linearizing networks 128 and 132 are substantially identical to and are further described in U.S. Pat. No. 3,973,201.

Although particular embodiments have been described in the foregoing Detailed Description, it will be understood that the present invention is capable of numerous rearrangements, modifications and substitutions of parts without departing from the spirit of the invention.

We claim:

1. A direct current responsive mixing circuit for receiving two input signals and a pump signal and producing an output signal having a signal component corresponding to the product of the input signals comprising:

first, second and third mixers, each of said mixers having a first D.C. responsive port, and second and third A.C. responsive ports, each of said mixers generating a signal at one of said ports corresponding to the product of signals received at the other two of said ports thereof;

said first port on said first and second mixers for respectively receiving the two input signals;

said second port on said first and said second of said mixers connected to receive the pump signal;

said third port on said first mixer connected to one of the A.C. responsive ports of said third mixer and said third port of said second mixer connected to the remaining one of said A.C. responsive ports of said third mixer; and said first port on said third mixer for producing an output signal corresponding to one-half the product of the two input signals and including a signal component having a frequency which is twice the frequency of the pump signal.

2. The circuit of claim 1 wherein each of said mixers comprises a double balanced diode mixer having three ports including an intermediate frequency port with direct current response.

3. A direct current responsive mixing circuit for receiving a pump signal and first and second input signals and for producing a final output signal, said circuit comprising:

first, second and third mixers, each of said mixers having first, second and third ports for receiving and transmitting signals;

said first port of said first mixer being D.C. responsive for receiving the first input signal;

said first port of said second mixer being D.C. responsive for receiving the second input signal;

said second port of each of said first and second mixers for receiving the pump signal;

said first mixer being operable to produce a first output signal at said third port of said first mixer corresponding to the product of the first input signal and the pump signal;

said second mixer being operable to produce a second output signal at said third port of said second mixer corresponding to the product of the second input signal and the pump signal; and said third mixer having a first A.C. responsive port thereof connected to said third port of said first mixer and having a second A.C. responsive port thereof connected to said third port of said second mixer to receive said first and second output signals and being operable to produce a final output signal at a D.C. responsive port of said third mixer, said final output signal corresponding to the product of the first and second output signals, whereby the final output signal includes a signal component which is one-half the product of the first and second input signals.

4. The circuit of claim 3 further comprising a local oscillator for generating the pump signal.

5. The circuit of claim 3 further comprising a low pass filter connected to said D.C. responsive port of said third mixer to filter out high frequency components of the final output signal to produce a filter output signal corresponding to one-half the product of the first and second input signals.

6. The circuit of claim 3 wherein each of said mixers comprises a double balanced diode mixer.

7. The circuit of claim 3 wherein said first and second mixers are double balanced diode mixers having diode quads with two diodes in each leg of the diode quads.

8. A D.C. responsive mixer circuit for multiplying a first input signal with a second input signal which comprises:

a first transformer having a primary coil for receiving a pump signal and having first and second secondary coils magnetically coupled to the primary coil of said first transformer;

a first terminal connected between a ground and a center tap of the first secondary coil of said first transformer;

a second terminal connected between the ground and a center tap of the second secondary coil of said first transformer;

a first double diode quad connected to the first secondary coil of said first transformer;

a second transformer having a primary coil connected to said first quad and having a secondary coil magnetically coupled to the primary coil of said second transformer;

a third terminal connected to a center tap of the primary coil of said second transformer for receiving the first input signal;

a fourth terminal connected between ground and a center tap of the secondary coil of said second transformer;

a second double diode quad connected to the second secondary coil of said first transformer;

a third transformer having a primary coil connected to said second quad and having a secondary coil magnetically coupled to the primary coil of said third transformer;

a diode quad connected between the secondary coils of said second and third transformers;

a fifth terminal connected to the center tap of the primary coil of said third transformer for receiving the second input signal; and a sixth terminal connected to the center tap of the secondary coil of said third transformer and forming an output terminal for producing a final output signal corresponding to the first input signal multiplied by the second input signal multiplied by the square of the pump signal, whereby said final output signal has a first component corresponding to one-half the product of the first and second signals and having a second component with a frequency of twice the pump signal frequency.

9. A direct current responsive mixer circuit for receiving first and second input signals and a pump signal and for producing a final output signal, said circuit comprising:

first, second and third mixers, each of said mixers having first and second ports for receiving signals and a third port for producing a signal corresponding to the product of the signals to the first and second ports, said first port of each of said mixers being D.C. responsive;

said first mixer for receiving the first input signal at said first port and for receiving the pump signal at said second port to produce a first output signal at said third port corresponding to the product of the pump signal and the first input signal;

said second mixer for receiving the second input signal at said first port and for receiving the first output signal at said second port to produce a second output signal at said third port corresponding to the product of the pump signal and the first and second input signals; and said third mixer for receiving the second output signal at said second port and for receiving the pump signal at said third port to produce a final output signal at said first port corresponding to the product of the first and second input signals and the square of the pump signal, whereby said final output signal has a first component corresponding to one-half the product of the first and second input signals and a second component having a frequency of twice the pump signal frequency.

10. The circuit of claim 9 further comprising a filter having an input connected to said first port of said third mixer and producing a filtered signal corresponding to one-half the product of the first and second input signal.

11. The circuit of claim 9 further comprising a local oscillator for generating the pump signal.

12. The circuit of claim 9 further comprising an attenuator for receiving the pump signal and for transmitting an attenuated pump signal to said second port of said first mixer, whereby the pump signal is attenuated to a signal level within the linear range of said first mixer.

13. A direct current responsive mixer circuit for receiving first and second input signals and a pump signal and for producing a final output signal, said circuit comprising:

first, second and third mixers, each of said mixers having first and second ports for receiving signals and a third port for producing a signal corresponding to the product of the signals to the first and second ports, said first port of each of said mixers being D.C. responsive;

said first mixer for receiving the first input signal at said first port and for receiving the pump signal at said second port to produce a first output signal at said third port corresponding to the product of the pump signal and the first input signal;

said second mixer for receiving the second input signal at said first port and for receiving the first output signal at said second port to produce a second output signal at said third port corresponding to the product of the pump signal and the first and second input signals;

said third mixer for receiving the second output signal at said second port and for receiving the pump signal at said third port to produce a final output signal at said first port corresponding to the product of the first and second input signals and the square of the pump signal, whereby said final output signal has a first component corresponding to one-half the product of the first and second input signals and a second component having a frequency of twice the pump signal frequency;

an attenuator for receiving the pump signal and for transmitting an attenuated pump signal to said second port of said first mixer, whereby the pump signal is attenuated to a signal level within the linear range of said first mixer;

a first linearizing network for receiving the first input signal and for transmitting a first linearized input signal to said first port of said first mixer; and a second linearizing network for receiving the second input signal and for transmitting a second linearized input signal to said first port of said second mixer.

* * * * *